(12) United States Patent
Song et al.

(10) Patent No.: US 7,482,203 B2
(45) Date of Patent: Jan. 27, 2009

(54) STACKED INTEGRATED CIRCUIT PACKAGE-IN-PACKAGE SYSTEM

(75) Inventors: Sungmin Song, Inchon (KR); Choong Bin Yim, Seongnam-si (KR); SeongMin Lee, Seoul (KR); Jaehyun Lim, Seoul (KR); Joungin Yang, Kyongkido (KR); DongSam Park, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/005,499

(22) Filed: Dec. 26, 2007

(65) Prior Publication Data
US 2008/0105965 A1    May 8, 2008

Related U.S. Application Data (63) Continuation of application No. 11/331,564, filed on Jan. 12, 2006, now Pat. No. 7,312,519.

(51) Int. Cl.
*H01L 21/00* (2006.01)
(52) U.S. Cl. ....................................... 438/109
(58) Field of Classification Search ................ 257/674, 257/666, 777, E23.414
See application file for complete search history.

(56) References Cited
U.S. PATENT DOCUMENTS

| | | | |
|---|---|---|---|
| 6,020,629 A | 2/2000 | Farnworth et al. | |
| 6,093,969 A | 7/2000 | Lin | |
| 6,734,541 B2 * | 5/2004 | Shimoe et al. | 257/686 |
| 6,740,981 B2 * | 5/2004 | Hosomi | 257/778 |
| 6,927,484 B2 | 8/2005 | Thomas et al. | |
| 6,939,739 B2 | 9/2005 | Corisis | |
| 2004/0113256 A1 | 6/2004 | Thomas et al. | |
| 2004/0145039 A1 | 7/2004 | Shim et al. | |
| 2004/0159954 A1 | 8/2004 | Hetzel et al. | |

* cited by examiner

*Primary Examiner*—Nathan W Ha
(74) *Attorney, Agent, or Firm*—Mikio Ishimaru (57) ABSTRACT

A stacked integrated circuit package-in-package system is provided forming a first device having a first integrated circuit package comprises forming a first substrate with a first integrated circuit thereon, electrically connecting first electrical interconnects between the first integrated circuit and a top side of the first substrate, encapsulating a first top molding compound to cover the first electrical interconnects and a portion of the top side of the first substrate, and encapsulating a first bottom molding compound to cover the first integrated circuit and a bottom side the first substrate, and stacking a second device, having a second integrated circuit package, below the first device with a second top molding compound of the second device providing a space between the first device and the second device, wherein the second device includes the second top molding compound and a second bottom molding compound in a similar manner to the first device.

20 Claims, 3 Drawing Sheets

STACKED INTEGRATED CIRCUIT PACKAGE-IN-PACKAGE SYSTEM

CROSS-REFERENCE TO RELATED APPLICATION(S)

This is a continuation of U.S. patent application Ser. No. 11/331,564 filed Jan. 12, 2006.

TECHNICAL FIELD

The present invention relates generally to integrated circuit packages and more particularly to stacked integrated circuit package-in-packages.

BACKGROUND ART

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. Still the demand continues for lower cost, smaller size and more functionality. The response in the assembly and packaging area are more advanced packages such as ball grid array (BGA), chip scale package (CSP), direct chip attach or wafer-level CSP.

Different fine-pitch BGA (FBGA) designs are already on the market and gaining widespread acceptance. These near-CSPs typically achieve die size plus 1.5 mm. Larger packages would therefore qualify for the CSP definition (package size=max. 1.2 times die size) while smaller packages would not. Developments continue to try to realize a die size plus 1.0 mm package.

The FBGA has been well accepted in the market because it uses standard process technology and package construction and is lower cost when compared with standard plastic BGA packages available today in the market. Even though the FBGA package uses standard process technology, it is still struggles to achieve low cost stacking of integrated circuits.

Thus, a need still remains for a stacked integrated circuit package-in-package system providing low cost manufacturing as well as reduce the integrated circuit package height. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides forming a first device having a first integrated circuit package comprises forming a first substrate with a first integrated circuit thereon, electrically connecting first electrical interconnects between the first integrated circuit and a top side of the first substrate, encapsulating a first top molding compound to cover the first electrical interconnects and a portion of the top side of the first substrate, and encapsulating a first bottom molding compound to cover the first integrated circuit and a bottom side the first substrate, and stacking a second device, having a second integrated circuit package, below the first device with a second top molding compound of the second device providing a space between the first device and the second device, wherein the second device includes the second top molding compound and a second bottom molding compound in a similar manner to the first device.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Figure 1:
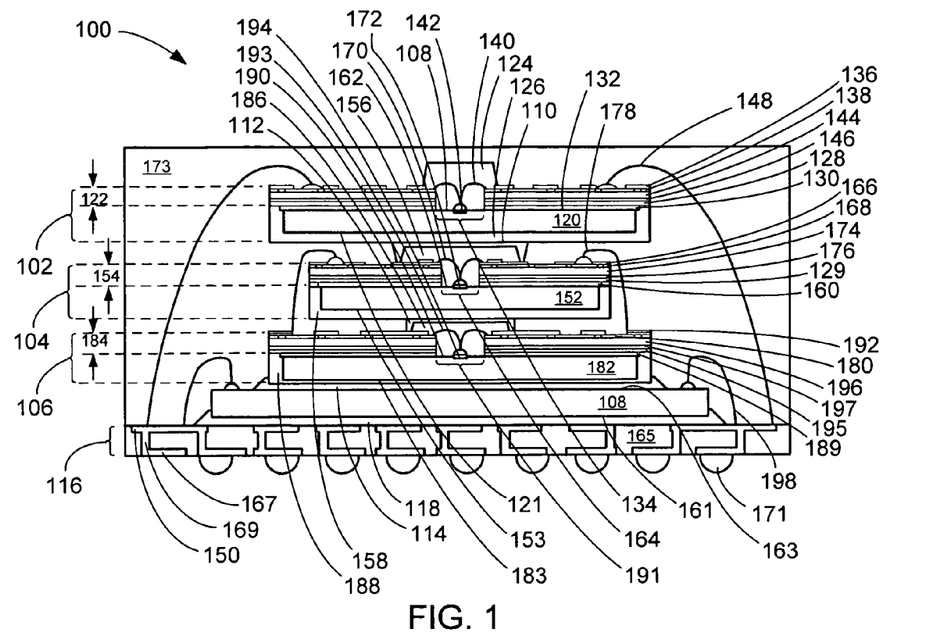
FIG. 1 is a cross-sectional view of a stacked integrated circuit package-in-package system in an embodiment of the present invention.

Referring now to FIG. 1, therein is shown a cross-sectional view of a stacked integrated circuit package-in-package system 100 in an embodiment of the present invention. The stacked integrated circuit package-in-package system 100 is a package-in-package system, such as a fine pitch ball grid array (FPBGA) package or a board on chip (BOC) package, with stacked devices having a first device 102 at the top of the stack above a second device 104, the second device 104 above a third device 106, and the third device 106 above a fourth device 108, such as an integrated circuit die.

The first device 102 attaches to the second device 104 with a first adhesive layer 110, such as an adhesive film or paste. The second device 104 attaches to the third device 106 with a second adhesive layer 112, such as an adhesive film or paste. The third device 106 attaches to the fourth device 108 with a third adhesive layer 114, such as an adhesive film or paste. The fourth device 108, such an integrated circuit, attaches to a package substrate 116 with a fourth adhesive layer 118, such as an adhesive film or paste.

The first device 102 includes a first two side molded integrated circuit package having a first integrated circuit 120 and a first substrate 122. The first device 102 may be tested separately to ensure known good die and package without the stacked integrated circuit package-in-package system 100. The first device 102 includes a first top molding compound 124 and a first bottom molding compound 126. The first top molding compound 124 and the first bottom molding compound 126 also serve as spacers for stacking other devices below or above the first device 102, respectively. This eliminates the need for separate discrete spacers resulting in lower cost, reduced manufacturing complexity, and lower height of the stacked integrated circuit package-in-package system 100.

The first bottom molding compound 126 encapsulates the first integrated circuit 120, from a first non-active side 121 of the first integrated circuit 120, and a surface of a first bottom dielectric layer 128 at a bottom side of the first substrate 122. A first inner adhesive layer 130, such as adhesive file or paste, attaches a first active side 132 of the first integrated circuit 120 to the first bottom dielectric layer 128 of the first substrate 122. The first bottom molding compound 126 also protects the first integrated circuit 120 and the mechanical attachment of the first integrated circuit 120 to the first substrate 122. The first bottom molding compound 126 serves as a spacer to mount the first device 102 over the second device 104.

The first top molding compound 124 encapsulates a first opening 134 of the first substrate 122, a portion of a first top dielectric layer 136 at a top side of the first substrate 122 adjacent to the first opening 134, and a portion of a first top metal layer 138 of the first substrate 122 adjacent to the first opening 134. The first opening 134 provides a space for first opening electrical interconnects 140, such as bond wires, to connect between first bonding pads 142 on the first active side 132 and the first top metal layer 138. The first top molding compound 124 also protects the first opening 134, the first opening electrical interconnects 140, the mechanical connections of the first opening electrical interconnects 140, the first active side 132 exposed by the first opening 134, the portion of the first top metal layer 138 adjacent to the first opening 134. The first top molding compound 124 may serve as a spacer allowing another device to mount above the first device 102.

The first substrate 122 includes the first top dielectric layer 136, the first top metal layer 138, a first intermediate dielectric layer 144, a first bottom metal layer 146, and the first bottom dielectric layer 128. The first top dielectric layer 136 isolates predetermined regions of the first top metal layer 138, such as a layer of metal traces, from each other and provides openings for electrical contact sites to the first top metal layer 138. First electrical interconnects 148, such as bond wires, connect between the first top metal layer 138 to a package top metal layer 150 at a top side of the package substrate 116.

The first intermediate dielectric layer 144 separates and electrically isolates the first top metal layer 138 and the first bottom metal layer 146, such as a layer of metal traces, except where electrical vias (not shown) may be formed. The electrical vias may be within the first intermediate dielectric layer 144 providing predetermined electrical conduction paths between the first top metal layer 138 and the first bottom metal layer 146.

The first bottom dielectric layer 128 isolates predetermined regions of the first bottom metal layer 146 from each other. The first bottom dielectric layer 128 may provide openings for electrical contact sites to the first bottom metal layer 146. The first active side 132 may electrically connect to the first bottom metal layer 146 through the predetermined openings of the first bottom dielectric layer 128.

For illustrative purposes, the first substrate 122 is shown as a two layer substrate, although it is understood that the number of layers may differ, as well. Also for illustrative purposes, the first electrical interconnects 148 are shown connecting the first top metal layer 138 to the package top metal layer 150, although it is understood that the connection may not be to the package top metal layer 150, as well.

Similarly, the second device 104 includes a second two side molded integrated circuit package having a second integrated circuit 152 and a second substrate 154. The second device 104 may be tested separately to ensure known good die and package without the stacked integrated circuit package-in-package system 100. The second device 104 includes a second top molding compound 156 and a second bottom molding compound 158. The second bottom molding compound 158 and the second bottom molding compound 158 also serve as spacers for stacking other device below or above the second device 104, respectively. This eliminates the need for separate spacers resulting in lower cost, reduced manufacturing complexity, and lower height of the stacked integrated circuit package-in-package system 100.

The second bottom molding compound 158 encapsulates the second integrated circuit 152, from a second non-active side 153 of the second integrated circuit 152, and a surface of a second bottom dielectric layer 129 at a bottom side of the second substrate 154. A second inner adhesive layer 160, such as adhesive file or paste, attaches a second active side 162 of the second integrated circuit 152 to the second bottom dielectric layer 129 of the second substrate 154. The second bottom molding compound 158 also protects the second integrated circuit 152 and the mechanical attachment of the second integrated circuit 152 to the second substrate 154. The second bottom molding compound 158 serves as a spacer to mount the second device 104 over the third device 106.

The second top molding compound 156 encapsulates a second opening 164 of the second substrate 154, a portion of a second top dielectric layer 166 at a top side of the second substrate 154 adjacent to the second opening 164, and a portion of a second top metal layer 168 of the second substrate 154 adjacent to the second opening 164. The second opening 164 provides a space for second opening electrical interconnects 170, such as bond wires, to connect between second bonding pads 172 on the second active side 162 and the second top metal layer 168. The second top molding compound 156 also protects the second opening 164, the second opening electrical interconnects 170, the mechanical connections of the second opening electrical interconnects 170, the second active side 162 exposed by the second opening 164, the portion of the second top metal layer 168 adjacent to the second opening 164. The second top molding compound 156 serves as a spacer allowing the first device 102 to mount above the second device 104. The first adhesive layer 110 attaches the second top molding compound 156 and the first bottom molding compound 126.

The second substrate 154 includes the second top dielectric layer 166, the second top metal layer 168, a second intermediate dielectric layer 174, a second bottom metal layer 176, and the second bottom dielectric layer 129. The second top dielectric layer 166 isolates predetermined regions of the second top metal layer 168, such as a layer of metal traces, from each other and provides openings for electrical contact sites to the second top metal layer 168. Second electrical interconnects 178, such as bond wires, connect between the second top metal layer 168 to a third top metal layer 180 of the third device 106. The first bottom molding compound 126 and the second top molding compound 156 provides a clearance for the second electrical interconnects 178 to connect to the second top metal layer 168.

The second intermediate dielectric layer 174 separates and electrically isolates the second top metal layer 168 and the second bottom metal layer 176, such as a layer of metal traces, except where electrical vias (not shown) may be formed. The electrical vias may be within the second intermediate dielectric layer 174 providing predetermined electrical conduction paths between the second top metal layer 168 and the second bottom metal layer 176.

The second bottom dielectric layer 129 isolates predetermined regions of the second bottom metal layer 176 from each other. The second bottom dielectric layer 129 may provide openings for electrical contact sites to the second bottom metal layer 176. The second active side 162 may electrically connect to the second bottom metal layer 176 through the predetermined openings of the second bottom dielectric layer 129.

For illustrative purposes, the second substrate 154 is shown as a two layer substrate, although it is understood that the number of layers may differ, as well. Also for illustrative purposes, the second device 104 is shown smaller than the first device 102, although it is understood that the second device 104 may not be smaller than the first device 102.

Similarly, the third device 106 includes a third two side molded integrated circuit package having a third integrated circuit 182 and a third substrate 184. The third device 106 may be tested separately to ensure known good die and package without the stacked integrated circuit package-in-package system 100. The third device 106 includes a third top molding compound 186 and a third bottom molding compound 188. The third bottom molding compound 188 and the third top molding compound 186 also serve as spacers for stacking other device below or above the third device 106, respectively. This eliminates the need for separate spacers resulting in lower cost, reduced manufacturing complexity, and lower height of the stacked integrated circuit package-in-package system 100.

The third bottom molding compound 188 encapsulates the third integrated circuit 182, from a third non-active side 183 of the third integrated circuit 182, and a surface of a third bottom dielectric layer 195 at a bottom side of the third substrate 184. A third inner adhesive layer 189, such as adhesive file or paste, attaches a third active side 190 of the third integrated circuit 182 to the third bottom dielectric layer 195 of the third substrate 184. The third bottom molding compound 188 also protects the third integrated circuit 182 and the mechanical attachment of the third integrated circuit 182 to the third substrate 184.

The third top molding compound 186 encapsulates a third opening 191 of the third substrate 184, a portion of a third top dielectric layer 192 at a top side of the third substrate 184 adjacent to the third opening 191, and a portion of the third top metal layer 180 of the third substrate 184 adjacent to the third opening 191. The third opening 191 provides a space for third opening electrical interconnects 193, such as bond wires, to connect between third bonding pads 194 on the third active side 190 and the third top metal layer 180. The third top molding compound 186 also protects the third opening 191, the third opening electrical interconnects 193, the mechanical connections of the third opening electrical interconnects 193, the third active side 190 exposed by the third opening 191, the portion of the third top metal layer 180 adjacent to the third opening 191. The third top molding compound 186 serves as a spacer allowing the second device 104 to mount above the third device 106. The second adhesive layer 112 attaches the third top molding compound 186 and the second bottom molding compound 158.

The third substrate 184 includes the third top dielectric layer 192, the third top metal layer 180, a third intermediate dielectric layer 196, a third bottom metal layer 197, and the third bottom dielectric layer 195. The third top dielectric layer 192 isolates predetermined regions of the third top metal layer 180, such as a layer of metal traces, from each other and provides openings for electrical contact sites to the third top metal layer 180. The second bottom molding compound 158 and the third top molding compound 186 serve as a spacer providing a clearance between the second device 104 and the third device 106.

The third intermediate dielectric layer 196 separates and electrically isolates the third top metal layer 180 and the third bottom metal layer 197, such as a layer of metal traces, except where electrical vias (not shown) may be formed. The electrical vias may be within the third intermediate dielectric layer 196 providing predetermined electrical conduction paths between the third top metal layer 180 and the third bottom metal layer 197.

The third bottom dielectric layer 195 isolates predetermined regions of the third bottom metal layer 197 from each other. The third bottom dielectric layer 195 may provide openings for electrical contact sites to the third bottom metal layer 197. The third active side 190 may electrically connect to the third bottom metal layer 197 through the predetermined openings of the third bottom dielectric layer 195.

For illustrative purposes, the third substrate 184 is shown as a two layer substrate, although it is understood that the number of layers may differ, as well. Also for illustrative purposes, the third device 106 is shown larger than the second device 104, although it is understood that the third device 106 may not be larger than the second device 104. Yet also for illustrative purposes, the second electrical interconnects 178 are shown connecting the second top metal layer 168 to the third top metal layer 180, although it is understood that the connection may not be to the third top metal layer 180, as well.

The fourth device 108, such as an integrated circuit die, includes a fourth non-active side 161 and a fourth active side 163, wherein the fourth active side 163 have circuitry fabricated thereon. The fourth device 108 may be tested separately to ensure known good die without the stacked integrated circuit package-in-package system 100. Third electrical interconnects 198 connect between the fourth active side 163 and the package top metal layer 150. The third adhesive layer 114 attaches the third bottom molding compound 188 to the fourth active side. The fourth adhesive layer 118 attaches the fourth non-active side 161 to the package substrate 116. For illustrative purposes, the third electrical interconnects 198 are shown connecting the fourth active side 163 to the package top metal layer 150, although it is understood that the connection may not be to the package top metal layer 150, as well.

The package substrate 116 includes the package top metal layer 150, a package dielectric 165, a package bottom metal layer 167, and substrate electrical vias 169. The package top metal layer 150 provides electrical contact sites to the first device 102, the second device 104, the third device 106, and the fourth device 108. The package dielectric 165 separates and electrically insulates regions of the package top metal layer 150 from each other and regions of the package bottom metal layer 167 from each other. The package dielectric 165 also separates and electrically isolates the package top metal layer 150 and the package bottom metal layer 167 except where the substrate electrical vias 169 are formed providing electrical conduction paths between the package top metal layer 150 and the package bottom metal layer 167. The package bottom metal layer 167 at a bottom side of the package substrate 116 provides electrical contact site for package electrical interconnects 171, such as solder balls. The package electrical interconnects 171 are attached to the package substrate 116 and used to connect to a next higher system level (not shown), such as a printed circuit board (PCB).

A package molding compound 173 encapsulates the first device 102, the second device 104, the third device 106, the fourth device 108, the first electrical interconnects 148, the second electrical interconnects 178, the third electrical interconnects, and the package substrate 116. The package molding compound 173 provides mechanical support to the stacked structure and also protects the fourth device 108.

Figure 2:
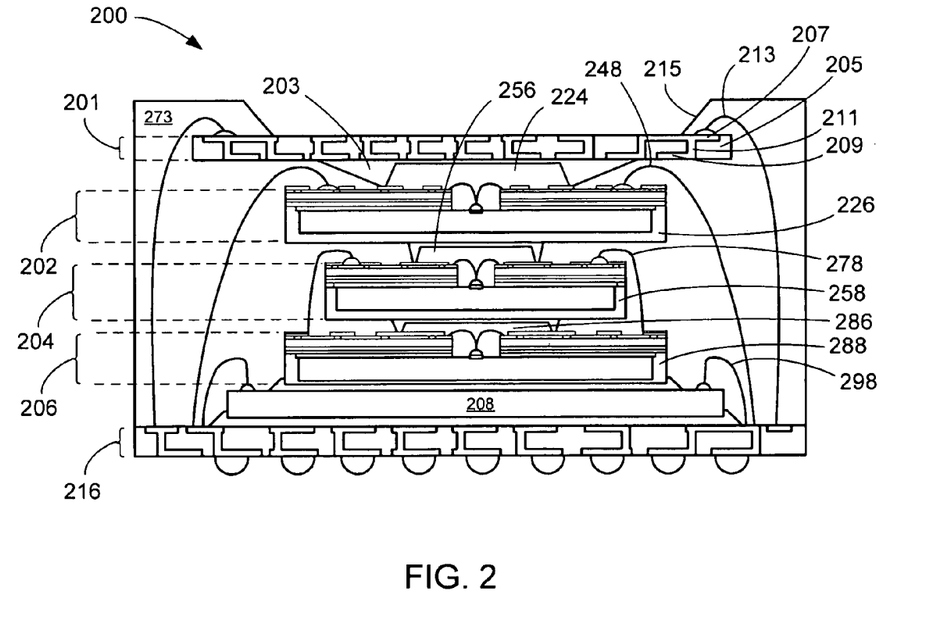
FIG. 2 is a cross-sectional view of a stacked integrated circuit package-in-package system in an alternative embodiment of the present invention.

Referring now to FIG. 2, therein is shown a cross-sectional view of a stacked integrated circuit package-in-package system 200 in an alternative embodiment of the present invention. Similar to the stacked integrated circuit package-in-package system 100 of FIG. 1, the stacked integrated circuit package-in-package system 200 is a package-in-package system, such as a fine pitch ball grid array (FPBGA) package or a board on chip (BOC) package, with stacked devices.

The stacked integrated circuit package-in-package system 200 includes a first device 202 at the top of the stack above a second device 204, the second device 204 above a third device 206, and the third device 206 above a fourth device 208, such as an integrated circuit die. The fourth device 208 is mounted on a package substrate 216.

The first device 202 is a two side molded integrated circuit package having a first top molding compound 224 and a first bottom molding compound 226. The first top molding compound 224 and the first bottom molding compound 226 serve as spacers. A top substrate 201 mounts above the first device 202 with a top adhesive layer 203 attaching the top substrate 201 to the first top molding compound 224.

The top substrate 201 includes a top substrate dielectric 205, an upper metal layer 207, a lower metal layer 209, and top electrical vias 211. The top substrate dielectric 205 separates and electrically isolates regions for the upper metal layer 207 from each other and regions of the lower metal layer 209 from each other. The top substrate dielectric 205 also separates and electrically isolates the upper metal layer 207 and the lower metal layer 209 except where the top electrical vias 211 are formed providing electrical conduction paths between the upper metal layer 207 and the lower metal layer 209. Top electrical interconnects 213 connect the upper metal layer 207 to the package substrate 216.

The second device 204 is a two side molded integrated circuit package having a second top molding compound 256 and a second bottom molding compound 258. The second top molding compound 256 and the second bottom molding compound 258 serve as spacers providing clearances for the first device 202 to mount above the second device 204 and for the second device 204 to mount above the third device 206.

The third device 206 is a two side molded integrated circuit package having a third top molding compound 286 and a third bottom molding compound 288. The third top molding compound 286 and the third bottom molding compound 288 serve as spacers providing clearances for the second device 204 to mount above the third device 206 and for the third device 206 to mount above the fourth device 208.

Similar to FIG. 1, first electrical interconnects 248 connect between the first device 202 and the package substrate 216. Second electrical interconnects 278 connect between the second device 204 and the third device 206. Third electrical interconnects 298 connect between the fourth device 208 and the package substrate 216.

A package molding compound 273 encapsulates the first device 202, the second device 204, the third device 206, the fourth device 208, the first electrical interconnects 248, the second electrical interconnects 278, the third electrical interconnects 298, the top electrical interconnects 213, the package substrate 216, and an outer portion of the top substrate 201. The package molding compound 273 protects and mechanical supports the stacked structure. The package molding compound 273 forms a recess 215 exposing an inner portion of the top substrate 201 for mounting other devices thereon.

Figure 3:
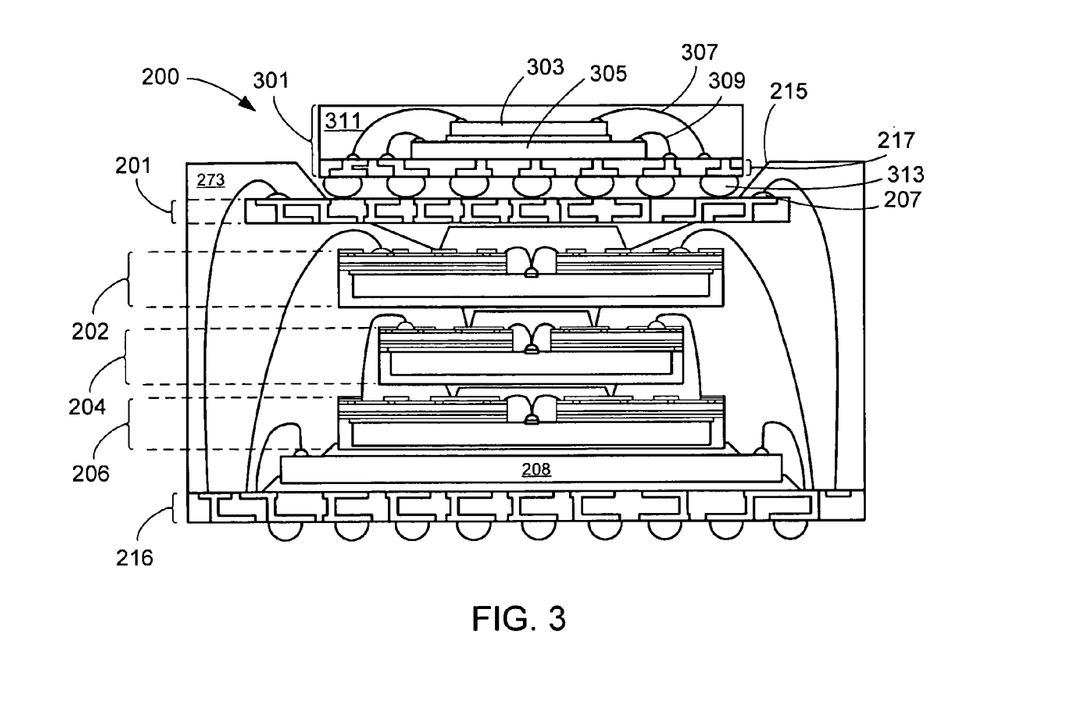
FIG. 3 is a cross-sectional view of the stacked integrated circuit package-in-package system of FIG. 2 having a packaged device mounted.

Referring now to FIG. 3, therein is shown a cross-sectional view of the stacked integrated circuit package-in-package system 200 of FIG. 2 having a packaged device 301 mounted. The stacked integrated circuit package-in-package system 200 includes the first device 202 at the top of the stack above the second device 204, the second device 204 above the third device 206, and the third device 206 above the fourth device 208. The fourth device 208 is mounted on the package substrate 216. The stacked integrated circuit package-in-package system 200 also includes the top substrate 201 mounted above the first device 202. The package molding compound 273 forms the recess 215 exposing the top substrate 201 for mounting other devices thereon.

The packaged device 301 includes a top integrated circuit 303, a bottom integrated circuit 305, long electrical interconnects 307, short electrical interconnects 309, an encapsulant 311, and a mounted package substrate 217. The top integrated circuit 303 stacks above the bottom integrated circuit 305. The long electrical interconnects 307 connect between the top integrated circuit 303 and the mounted package substrate 217. The short electrical interconnects 309 connect between the bottom integrated circuit 305 and the mounted package substrate 217. The encapsulant 311 covers the top integrated circuit 303, the bottom integrated circuit 305, the long electrical interconnects 307, and the short electrical interconnects 309. Mounted package electrical interconnects 313 attach to the bottom of the mounted package substrate 217. The mounted package electrical interconnects 313 attach to the upper metal layer 207 of the top substrate 201.

Figure 4:
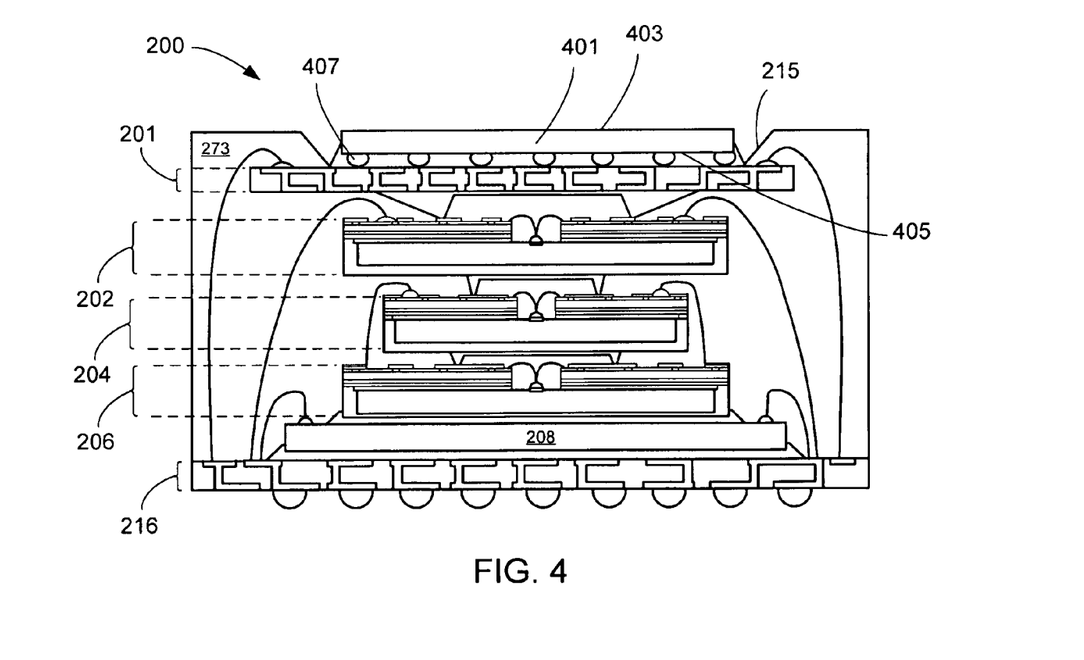
FIG. 4 is a cross-sectional view of the stacked integrated circuit package-in-package system of FIG. 2 having an integrated circuit die mounted.

Referring now to FIG. 4, therein is shown a cross-sectional view of the stacked integrated circuit package-in-package system 200 of FIG. 2 having an integrated circuit die 401 mounted. The stacked integrated circuit package-in-package system 200 includes the first device 202 at the top of the stack above the second device 204, the second device 204 above the third device 206, and the third device 206 above the fourth device 208. The fourth device 208 is mounted on the package substrate 216. The stacked integrated circuit package-in-package system 200 also includes the top substrate 201 mounted above the first device 202. The package molding compound 273 forms the recess 215 exposing the top substrate 201 for mounting other devices thereon.

The integrated circuit die 401, such as a flip chip, includes a non-active side 403 and an active side 405, wherein the active side 405 has circuitry fabricated thereon. Die interconnects 407, such as solder bumps, attach to the active side 405. The die interconnects 407 connect to the top substrate 201.

Figure 5:
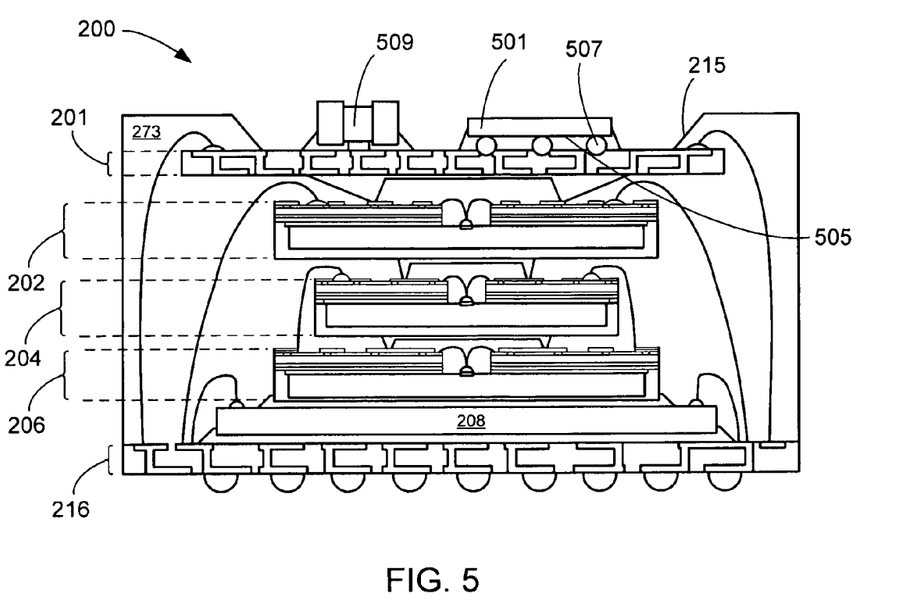
FIG. 5 is a cross-sectional view of the stacked integrated circuit package-in-package system of FIG. 2 having multiple devices mounted.

Referring now to FIG. 5, therein is shown a cross-sectional view of the stacked integrated circuit package-in-package system 200 of FIG. 2 having multiple devices mounted. The stacked integrated circuit package-in-package system 200 includes the first device 202 at the top of the stack above the second device 204, the second device 204 above the third device 206, and the third device 206 above the fourth device 208. The fourth device 208 is mounted on the package substrate 216. The stacked integrated circuit package-in-package system 200 also includes the top substrate 201 mounted above the first device 202. The package molding compound 273 forms the recess 215 exposing the top substrate 201 for mounting other devices thereon.

A passive device 509 and an integrated circuit die 501 are the multiple devices shown. Similarly, the integrated circuit die 501, such as a flip chip, includes die interconnects 507, such as solder bumps, attached to an active side 505 of the integrated circuit die 501. Die interconnects 507 connect to the top substrate 201. The passive device 509 also mounts on the top substrate 201 next to the integrated circuit die 501.

For illustrative purposes, the passive device 509 and the integrated circuit die 501 are shown mounted side by side, although it is understood different types of devices may be mounted differently, as well.

Figure 6:
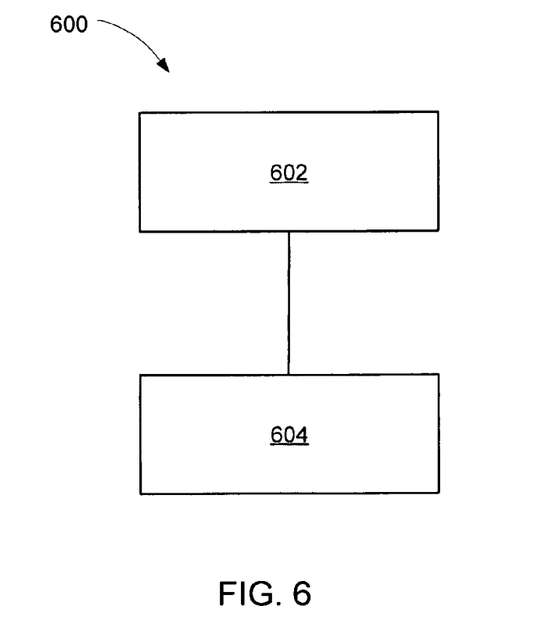
FIG. 6 is a flow chart of a stacked integrated circuit package-in-package system for manufacturing the stacked integrated circuit package-in-package in an embodiment of the present invention.

Referring now to FIG. 6, therein is shown a flow chart of a stacked integrated circuit package-in-package system 600 for manufacturing the stacked integrated circuit package-in-package system 100 in an embodiment of the present invention. The system 600 includes providing forming a first device having a first integrated circuit package comprises forming a first substrate with a first integrated circuit thereon, electrically connecting first electrical interconnects between the first integrated circuit and a top side of the first substrate, encapsulating a first top molding compound to cover the first electrical interconnects and a portion of the top side of the first substrate, and encapsulating a first bottom molding compound to cover the first integrated circuit and a bottom side the first substrate in a block 602; and stacking a second device, having a second integrated circuit package, below the first device with a second top molding compound of the second device providing a space between the first device and the second device, wherein the second device includes the second top molding compound and a second bottom molding compound in a similar manner to the first device in a block 604.

It has been discovered that the present invention thus has numerous aspects.

It has been discovered that the stacked integrated circuit package-in-package system provides a stacking structure without the use of discrete spacers reducing the overall package height and size. The two side molded body provides the clearance needed to stack package-in-package enabling multiple systems in a package.

An aspect is that the present invention provides BOC package mold body on two sides. In the vertical interconnection or the Z-interconnection of the package stack or die to package, BOC bottom mold body can serve as spacer that provides clearance for Z-interconnection wire bonds. It is possible to reduce spacer die attaching process.

Another aspect of the present invention is to increase the integrated circuit density by using bottom mold body of BOC package instead of dummy spacer to stack packages. By reducing bottom mold height, it is possible to reduce the total package height and total package size.

Yet another aspect of the present invention is that multi-functional output may be provided with one package by attaching various semiconductor package, semiconductor die and passive component on package-in-package (PIP) using BOC PKG as internal stacking package. The recess of the package mold or partially exposed lid, it is possible to make multiple systems in package.

Yet another aspect of the present invention is reduce cost and manufacturing complexity. The bottom mold height serves as spacer eliminating the spacer and the spacer attach process.

Thus, it has been discovered that the stacked integrated circuit package-in-package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit package-in-packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A stacked integrated circuit package-in-package system comprising:
    forming a first device having a first integrated circuit package comprises:
        forming a first substrate with a first integrated circuit thereon,
        electrically connecting first electrical interconnects between the first integrated circuit and a top side of the first substrate,
        encapsulating a first top molding compound to cover the first electrical interconnects and a portion of the top side of the first substrate, and
        encapsulating a first bottom molding compound to cover the first integrated circuit and a bottom side of the first substrate; and
    stacking a second device, having a second integrated circuit package, below the first device with a second top molding compound of the second device providing a space between the first device and the second device, wherein the second device includes the second top molding compound and a second bottom molding compound in a similar manner to the first device.

2. The system as claimed in claim 1 wherein stacking the second device comprises:
    forming a package substrate with the second device thereon;

mounting a top substrate on the first top molding compound;

encapsulating a package molding compound to cover the first device, the second device, and the package substrate;

forming a recess in the package molding compound covering an outer portion of the top substrate and exposing the inner portion of the top substrate; and mounting a packaged device on the top substrate.

3. The system as claimed in claim 1 wherein stacking the second device comprises:

forming a package substrate with the second device thereon;

mounting a top substrate on the first top molding compound;

encapsulating a package molding compound to cover the first device, the second device, and the package substrate;

forming a recess in the package molding compound covering an outer portion of the top substrate and exposing the inner portion of the top substrate; and mounting an integrated circuit die on the top substrate.

4. The system as claimed in claim 1 wherein stacking the second device comprises:

forming a package substrate with the second device thereon;

mounting a top substrate on the first top molding compound;

encapsulating a package molding compound to cover the first device, the second device, and the package substrate;

forming a recess in the package molding compound covering an outer portion of the top substrate and exposing the inner portion of the top substrate;

mounting a passive device on the top substrate; and mounting an integrated circuit die on the top substrate next to the passive device.

5. The system as claimed in claim 1 further comprising stacking a third device below the second device with the second bottom molding compound provides a space between the third device and the second device.

6. A stacked integrated circuit package-in-package system comprising:

forming a first device having a first integrated circuit package comprises:

forming a first substrate having a first opening, mounting a first integrated circuit on the first substrate over the first opening, wherein a first active side of the first integrated circuit attaches to a first bottom side of the first substrate, electrically connecting first opening electrical interconnects between the first active side and a first top side of the first substrate, wherein the first opening provides space for the first electrical interconnects, encapsulating a first top molding compound to cover the first opening electrical interconnects, the first opening, and a portion of the first top side of the first substrate, and encapsulating a first bottom molding compound to cover the first integrated circuit and a first bottom side of the first substrate;

stacking a second device, having a second integrated circuit package, below the first device with the first bottom molding compound and a second top molding compound of the second device providing a space between the first device and the second device, wherein the second device includes the second top molding compound and a second bottom molding compound similar to the first device;

mounting a package substrate with the second device, wherein the second device includes the second top molding compound and a second bottom molding compound in similar manner to the first device;

electrically connecting a first electrical interconnects to a second top side of a second substrate of the second device; and encapsulating a package molding compound to cover the first device, the second device, the first electrical interconnects and the package substrate.

7. The system as claimed in claim 6 wherein stacking the second device below the first device comprises forming a clearance for the first electrical interconnects.

8. The system as claimed in claim 6 further comprising stacking an integrated circuit die below the second device.

9. The system as claimed in claim 6 wherein connecting the first opening electrical interconnects comprises connecting bond wires.

10. The system as claimed in claim 6 wherein connecting the first electrical interconnects comprises connecting bond wires.

11. A stacked integrated circuit package-in-package system comprising:

a first device having a first integrated circuit package comprises:

a first substrate with a first integrated circuit thereon, first electrical interconnects between the first integrated circuit and a top side of the first substrate, a first top molding compound to cover the first electrical interconnects and a portion of the top side of the first, and a first bottom molding compound to cover the first integrated circuit and a bottom side of the first substrate; and a second device, having a second integrated circuit package, below the first device with a second top molding compound of the second device provided a space between the first device and the second device, wherein the second device includes the second top molding compound and a second bottom molding compound in similar manner to the first device.

12. The system as claimed in claim 11 wherein the second device comprises:

a package substrate with the second device thereon;

a top substrate on the second top molding compound;

a package molding compound to cover the first device, the second device, and the package substrate;

a recess in the package molding compound with an outer portion of the top substrate covered and the inner portion of the top substrate exposed; and a packaged device on the top substrate.

13. The system as claimed in claim 11 wherein the second device comprises:

a package substrate with the second device thereon;

a top substrate on the first top molding compound;

a package molding compound to cover the first device, the second device, and the package substrate;

a recess in the package molding compound with an outer portion of the top substrate covered and the inner portion of the top substrate exposed; and an integrated circuit die on the top substrate.

14. The system as claimed in claim 11 wherein the second device comprises:

a package substrate with the second device thereon;

a top substrate on the first top molding compound;
a package molding compound to cover the first device, the second device, and the package substrate;
a recess in the package molding compound with an outer portion of the top substrate covered and the inner portion of the top substrate exposed;
a passive device on the top substrate; and
an integrated circuit die on the top substrate next to the passive device.

15. The system as claimed in claim 11 further comprising a third device below the second device with the second bottom molding compound provides a space between the third device and the second device.

16. The system as claimed in claim 11 wherein:
the first device having the first integrated circuit package includes:
  the first substrate being a two layer substrate,
  the first integrated circuit having a first non-active side of the first integrated circuit not attached to the first substrate,
  the first opening electrical interconnects is connected to the first active side,
  the first top molding compound to cover the first opening electrical interconnects and a portion of the top side of the first substrate over a portion of the first active side,
  the first bottom molding compound to cover the first integrated circuit and the first substrate over a first non-active side of the first integrated circuit, and
the second device, having a second integrated circuit package, below the first device with the first bottom molding compound is attached with a first adhesive layer; and
further comprising:
  a first opening in the first substrate, wherein the first integrated circuit on the first substrate is over the first opening, and the first opening provides space for the first opening electrical interconnects,
  a package substrate with the second device, wherein the second device includes the second top molding compound and a second bottom molding compound in similar manner to the first device,
  a first electrical interconnects to a second top side of a second substrate of the second device, and
  a package molding compound to cover the first device, the second device, the first electrical interconnects and the package substrate.

17. The system as claimed in claim 16 wherein the second device below the first device has a clearance for the first electrical interconnects.

18. The system as claimed in claim 16 further comprising an integrated circuit die below the second device.

19. The system as claimed in claim 16 wherein the first opening electrical interconnects comprises bond wires.

20. The system as claimed in claim 16 wherein the first electrical interconnects comprises bond wires.

* * * * *